(12) United States Patent
Shirakawa et al.

(10) Patent No.: US 7,965,552 B2
(45) Date of Patent: Jun. 21, 2011

(54) NON-VOLATILE SEMICONDUCTOR MEMORY DEVICE

(75) Inventors: Masanobu Shirakawa, Chigasaki (JP); Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/343,990

(22) Filed: Dec. 24, 2008

(65) Prior Publication Data

US 2009/0168523 A1     Jul. 2, 2009

(30) Foreign Application Priority Data

Dec. 27, 2007  (JP) ................................. 2007-335552

(51) Int. Cl.
*G11C 16/04* (2006.01)
*G11C 8/10* (2006.01)
*G11C 5/02* (2006.01)
*G11C 29/00* (2006.01)

(52) U.S. Cl. ......... 365/185.09; 365/185.11; 365/230.06; 365/51; 365/200; 365/185.17

(58) Field of Classification Search ........................ None
See application file for complete search history.

(56) References Cited

U.S. PATENT DOCUMENTS

| 5,848,009 A | * | 12/1998 | Lee et al. | 365/200 |
| 7,388,782 B2 | | 6/2008 | Tokiwa | |
| 7,466,600 B2 | * | 12/2008 | Roohparvar | 365/189.05 |

FOREIGN PATENT DOCUMENTS

JP          2001-273798          10/2001

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A non-volatile semiconductor memory device includes: a memory cell array; a bad block position data register area defined in the memory cell array to store bad block position data; an address decoder circuit configured to select a block in the cell array; and bad block flag latches disposed in the address decoder circuit, bad block flags being set in the bad block flag latches in accordance with the bad block position data read out the bad block position data register area, wherein the bad block position data in the bad block position data register area are defined by such a bit position assignment scheme that one bit is assigned to one block under the condition that block positions in the cell array and column positions in one page are set in one-to-one correspondence.

18 Claims, 14 Drawing Sheets

[Conventional]

[Embodiment]

FIG. 9

| BLOCK ADDESS | AROWA | AROWB | AROWC | AROWD | AROWE |
|---|---|---|---|---|---|
| 0 | 0 0 0 1 | 0 0 0 1 | 0 0 0 1 | 0 0 0 1 | 0 0 0 1 |
| 1 | 0 0 1 0 | 0 0 0 1 | 0 0 0 1 | 0 0 0 1 | 0 0 0 1 |
| 2 | 0 1 0 0 | 0 0 0 1 | 0 0 0 1 | 0 0 0 1 | 0 0 0 1 |
| 3 | 1 0 0 0 | 0 0 0 1 | 0 0 0 1 | 0 0 0 1 | 0 0 0 1 |
| 4 | 0 0 0 1 | 0 0 1 0 | 0 0 0 1 | 0 0 0 1 | 0 0 0 1 |
| 5 | 0 0 1 0 | 0 0 1 0 | 0 0 0 1 | 0 0 0 1 | 0 0 0 1 |
| 6 | 0 1 0 0 | 0 0 1 0 | 0 0 0 1 | 0 0 0 1 | 0 0 0 1 |
| 7 | 1 0 0 0 | 0 0 1 0 | 0 0 0 1 | 0 0 0 1 | 0 0 0 1 |
| 8 | 0 0 0 1 | 0 1 0 0 | 0 0 0 1 | 0 0 0 1 | 0 0 0 1 |
| 9 | 0 0 1 0 | 0 1 0 0 | 0 0 0 1 | 0 0 0 1 | 0 0 0 1 |
| 10 | 0 1 0 0 | 0 1 0 0 | 0 0 0 1 | 0 0 0 1 | 0 0 0 1 |
| 11 | 1 0 0 0 | 0 1 0 0 | 0 0 0 1 | 0 0 0 1 | 0 0 0 1 |
| 12 | 0 0 0 1 | 1 0 0 0 | 0 0 0 1 | 0 0 0 1 | 0 0 0 1 |
| 13 | 0 0 1 0 | 1 0 0 0 | 0 0 0 1 | 0 0 0 1 | 0 0 0 1 |
| 14 | 0 1 0 0 | 1 0 0 0 | 0 0 0 1 | 0 0 0 1 | 0 0 0 1 |
| 15 | 1 0 0 0 | 1 0 0 0 | 0 0 0 1 | 0 0 0 1 | 0 0 0 1 |
| 16 | 0 0 0 1 | 0 0 0 1 | 0 0 1 0 | 0 0 0 1 | 0 0 0 1 |
| 17 | 0 0 1 0 | 0 0 0 1 | 0 0 1 0 | 0 0 0 1 | 0 0 0 1 |
| 18 | 0 1 0 0 | 0 0 0 1 | 0 0 1 0 | 0 0 0 1 | 0 0 0 1 |
| 19 | 1 0 0 0 | 0 0 0 1 | 0 0 1 0 | 0 0 0 1 | 0 0 0 1 |
| 20 | 0 0 0 1 | 0 0 1 0 | 0 0 1 0 | 0 0 0 1 | 0 0 0 1 |
| 21 | 0 0 1 0 | 0 0 1 0 | 0 0 1 0 | 0 0 0 1 | 0 0 0 1 |
| 22 | 0 1 0 0 | 0 0 1 0 | 0 0 1 0 | 0 0 0 1 | 0 0 0 1 |
| 23 | 1 0 0 0 | 0 0 1 0 | 0 0 1 0 | 0 0 0 1 | 0 0 0 1 |
| 24 | 0 0 0 1 | 0 1 0 0 | 0 0 1 0 | 0 0 0 1 | 0 0 0 1 |
| 25 | 0 0 1 0 | 0 1 0 0 | 0 0 1 0 | 0 0 0 1 | 0 0 0 1 |
| 26 | 0 1 0 0 | 0 1 0 0 | 0 0 1 0 | 0 0 0 1 | 0 0 0 1 |
| 27 | 1 0 0 0 | 0 1 0 0 | 0 0 1 0 | 0 0 0 1 | 0 0 0 1 |
| 28 | 0 0 0 1 | 1 0 0 0 | 0 0 1 0 | 0 0 0 1 | 0 0 0 1 |
| 29 | 0 0 1 0 | 1 0 0 0 | 0 0 1 0 | 0 0 0 1 | 0 0 0 1 |
| 30 | 0 1 0 0 | 1 0 0 0 | 0 0 1 0 | 0 0 0 1 | 0 0 0 1 |
| 31 | 1 0 0 0 | 1 0 0 0 | 0 0 1 0 | 0 0 0 1 | 0 0 0 1 |
| 32 | 0 0 0 1 | 0 0 0 1 | 0 1 0 0 | 0 0 0 1 | 0 0 0 1 |
| ⋮ | | | | | |
| 1023 | 1 0 0 0 | 1 0 0 0 | 1 0 0 0 | 1 0 0 0 | 1 0 0 0 |

FIG. 10

| BLOCK ADDESS | AROWA | AROWB | AROWC | AROWD | AROWE |
|---|---|---|---|---|---|
| 0 | 00000001 | 0001 | 0001 | 0001 | 01 |
| 1 | 00000010 | 0001 | 0001 | 0001 | 01 |
| 2 | 00000100 | 0001 | 0001 | 0001 | 01 |
| 3 | 00001000 | 0001 | 0001 | 0001 | 01 |
| 4 | 00010000 | 0001 | 0001 | 0001 | 01 |
| 5 | 00100000 | 0001 | 0001 | 0001 | 01 |
| 6 | 01000000 | 0001 | 0001 | 0001 | 01 |
| 7 | 10000000 | 0001 | 0001 | 0001 | 01 |
| 8 | 00000001 | 0010 | 0001 | 0001 | 01 |
| 9 | 00000010 | 0010 | 0001 | 0001 | 01 |
| 10 | 00000100 | 0010 | 0001 | 0001 | 01 |
| 11 | 00001000 | 0010 | 0001 | 0001 | 01 |
| 12 | 00010000 | 0010 | 0001 | 0001 | 01 |
| 13 | 00100000 | 0010 | 0001 | 0001 | 01 |
| 14 | 01000000 | 0010 | 0001 | 0001 | 01 |
| 15 | 10000000 | 0010 | 0001 | 0001 | 01 |
| 16 | 00000001 | 0100 | 0001 | 0001 | 01 |
| 17 | 00000010 | 0100 | 0001 | 0001 | 01 |
| 18 | 00000100 | 0100 | 0001 | 0001 | 01 |
| 19 | 00001000 | 0100 | 0001 | 0001 | 01 |
| 20 | 00010000 | 0100 | 0001 | 0001 | 01 |
| 21 | 00100000 | 0100 | 0001 | 0001 | 01 |
| 22 | 01000000 | 0100 | 0001 | 0001 | 01 |
| 23 | 10000000 | 0100 | 0001 | 0001 | 01 |
| 24 | 00000001 | 1000 | 0001 | 0001 | 01 |
| 25 | 00000010 | 1000 | 0001 | 0001 | 01 |
| 26 | 00000100 | 1000 | 0001 | 0001 | 01 |
| 27 | 00001000 | 1000 | 0001 | 0001 | 01 |
| 28 | 00010000 | 1000 | 0001 | 0001 | 01 |
| 29 | 00100000 | 1000 | 0001 | 0001 | 01 |
| 30 | 01000000 | 1000 | 0001 | 0001 | 01 |
| 31 | 10000000 | 1000 | 0001 | 0001 | 01 |
| 32 | 00000001 | 0001 | 0010 | 0001 | 01 |
| ⋮ | | | | | |
| 1023 | 10000000 | 1000 | 1000 | 1000 | 10 |

FIG. 14

| BLOCK ADDESS | AROWA | AROWB | AROWC | AROWD | AROWE | Left/Right |
|---|---|---|---|---|---|---|
| 0 | 0 0 0 1 | 0 0 0 1 | 0 0 0 1 | 0 0 0 1 | 0 1 | 0 |
| 1 | 0 0 0 1 | 0 0 0 1 | 0 0 0 1 | 0 0 0 1 | 0 1 | 1 |
| 2 | 0 0 1 0 | 0 0 0 1 | 0 0 0 1 | 0 0 0 1 | 0 1 | 0 |
| 3 | 0 0 1 0 | 0 0 0 1 | 0 0 0 1 | 0 0 0 1 | 0 1 | 1 |
| 4 | 0 1 0 0 | 0 0 0 1 | 0 0 0 1 | 0 0 0 1 | 0 1 | 0 |
| 5 | 0 1 0 0 | 0 0 0 1 | 0 0 0 1 | 0 0 0 1 | 0 1 | 1 |
| 6 | 1 0 0 0 | 0 0 0 1 | 0 0 0 1 | 0 0 0 1 | 0 1 | 0 |
| 7 | 1 0 0 0 | 0 0 0 1 | 0 0 0 1 | 0 0 0 1 | 0 1 | 1 |
| 8 | 0 0 0 1 | 0 0 1 0 | 0 0 0 1 | 0 0 0 1 | 0 1 | 0 |
| 9 | 0 0 0 1 | 0 0 1 0 | 0 0 0 1 | 0 0 0 1 | 0 1 | 1 |
| 10 | 0 0 1 0 | 0 0 1 0 | 0 0 0 1 | 0 0 0 1 | 0 1 | 0 |
| 11 | 0 0 1 0 | 0 0 1 0 | 0 0 0 1 | 0 0 0 1 | 0 1 | 1 |
| 12 | 0 1 0 0 | 0 0 1 0 | 0 0 0 1 | 0 0 0 1 | 0 1 | 0 |
| 13 | 0 1 0 0 | 0 0 1 0 | 0 0 0 1 | 0 0 0 1 | 0 1 | 1 |
| 14 | 1 0 0 0 | 0 0 1 0 | 0 0 0 1 | 0 0 0 1 | 0 1 | 0 |
| 15 | 1 0 0 0 | 0 0 1 0 | 0 0 0 1 | 0 0 0 1 | 0 1 | 1 |
| 16 | 0 0 0 1 | 0 1 0 0 | 0 0 0 1 | 0 0 0 1 | 0 1 | 0 |
| 17 | 0 0 0 1 | 0 1 0 0 | 0 0 0 1 | 0 0 0 1 | 0 1 | 1 |
| 18 | 0 0 1 0 | 0 1 0 0 | 0 0 0 1 | 0 0 0 1 | 0 1 | 0 |
| 19 | 0 0 1 0 | 0 1 0 0 | 0 0 0 1 | 0 0 0 1 | 0 1 | 1 |
| 20 | 0 1 0 0 | 0 1 0 0 | 0 0 0 1 | 0 0 0 1 | 0 1 | 0 |
| 21 | 0 1 0 0 | 0 1 0 0 | 0 0 0 1 | 0 0 0 1 | 0 1 | 1 |
| 22 | 1 0 0 0 | 0 1 0 0 | 0 0 0 1 | 0 0 0 1 | 0 1 | 0 |
| 23 | 1 0 0 0 | 0 1 0 0 | 0 0 0 1 | 0 0 0 1 | 0 1 | 1 |
| 24 | 0 0 0 1 | 1 0 0 0 | 0 0 0 1 | 0 0 0 1 | 0 1 | 0 |
| 25 | 0 0 0 1 | 1 0 0 0 | 0 0 0 1 | 0 0 0 1 | 0 1 | 1 |
| 26 | 0 0 1 0 | 1 0 0 0 | 0 0 0 1 | 0 0 0 1 | 0 1 | 0 |
| 27 | 0 0 1 0 | 1 0 0 0 | 0 0 0 1 | 0 0 0 1 | 0 1 | 1 |
| 28 | 0 1 0 0 | 1 0 0 0 | 0 0 0 1 | 0 0 0 1 | 0 1 | 0 |
| ■ | ■ | ■ | ■ | ■ | ■ | ■ |
| 1017 | 0 0 0 1 | 1 0 0 0 | 1 0 0 0 | 1 0 0 0 | 1 0 | 1 |
| 1018 | 0 0 1 0 | 1 0 0 0 | 1 0 0 0 | 1 0 0 0 | 1 0 | 0 |
| 1019 | 0 0 1 0 | 1 0 0 0 | 1 0 0 0 | 1 0 0 0 | 1 0 | 1 |
| 1020 | 0 1 0 0 | 1 0 0 0 | 1 0 0 0 | 1 0 0 0 | 1 0 | 0 |
| 1021 | 0 1 0 0 | 1 0 0 0 | 1 0 0 0 | 1 0 0 0 | 1 0 | 1 |
| 1022 | 1 0 0 0 | 1 0 0 0 | 1 0 0 0 | 1 0 0 0 | 1 0 | 0 |
| 1023 | 1 0 0 0 | 1 0 0 0 | 1 0 0 0 | 1 0 0 0 | 1 0 | 1 |

NON-VOLATILE SEMICONDUCTOR MEMORY DEVICE

CROSS-REFERENCE TO RELATED APPLICATION

This application is based on and claims the benefit of priority from the prior Japanese Patent Application No. 2007-335552, filed on Dec. 27, 2007, the entire contents of which are incorporated herein by reference.

BACKGROUND OF THE INVENTION

1. Field of the Invention

This invention relates to an electrically rewritable and non-volatile semiconductor memory device (EEPROM), specifically relates to an improvement of the bad address register scheme.

2. Description of the Related Art

A NAND-type flash memory is well-known as a typical one of EEPROMs. In the currently manufactured NAND-type flash memories, even if bad blocks are detected in the die-sort test, it is allowed of bad blocks, the number of which is less than a certain value. The reason is as follows: allowing of the bad blocks, the number of which is less than a certain value, it becomes possible to increase the throughput of the device.

However, it is required of the bad blocks to be controlled in a scheme different from the normal blocks. For example, the bad block addresses must be registered in a ROM fuse area defined in the memory cell array. The bad block addresses registered in the ROM fuse area will be read out in a power-on reset operation executed every power-on time, and the corresponding row decoders are selected, whereby bad block flags are set in the bad block flag latches in these row decoders.

Once a bad block flag is set in a row decoder, the corresponding block is recognized as a bad block by the memory controller, and it becomes possible to control the memory so as to estimate the influence of the bad block (for example, refer to JP-A-2001-273798).

The bad block address register scheme will be explained in detail in such a case that a memory chip is formed of one plane with 1024 blocks, and the capacity of one page is 1 k Byte. It is necessary for this chip with 1024 blocks to express the block addresses by 10 bits. In a usual data processing, 8 bits (=1 Byte) constitute a data unit. Therefore, to register one block address, it is in need of preparing an area of 2 Byte.

On the other hand, since it is required of the ROM fuse area to have a high reliability, complementary data will be used. Comparing true data with complementary data at a read time, it becomes possible to secure a high reliability. In this case, in order to register one block address, it will be necessary to use an area of 4 Byte.

Further, considering such a situation that a data error occurs due to the data comparison, it is desired to use multiple data sets each constituted by true data and complementary data. Assuming that two data sets are prepared, it becomes necessary to use an area of 8 Byte for registering one block address. In this case, it should be noted that only 128 blocks can be registered in a NAND-type flash memory, one page capacity of which is 1 k Byte.

If there are 129 or more bad blocks detected in a chip with 1024 blocks in the above-described example, the chip is dealt with as a bad one, and will not be shipped.

SUMMARY OF THE INVENTION

According to an aspect of the present invention, there is provided a non-volatile semiconductor memory device including:

a memory cell array formed of multiple blocks, in which electrically rewritable and non-volatile memory cells are arranged;

a bad block position data register area defined in the memory cell array to store bad block position data;

an address decoder circuit configured to select a block in the memory cell array; and bad block flag latches disposed in the address decoder circuit, bad block flags being set in the bad block flag latches in accordance with the bad block position data read out the bad block position data register area, wherein the bad block position data in the bad block position data register area are defined by such a bit position assignment scheme that one bit is assigned to one block under the condition that block positions in the memory cell array and column positions in one page defined as a set of simultaneously accessed memory cells in a selected block are set in one-to-one correspondence.

According to another aspect of the present invention, there is provided a non-volatile semiconductor memory device including:

a memory cell array formed of electrically rewritable and non-volatile memory cells arranged therein; the memory cell array including multiple block sets each containing M blocks, a set of the memory cells simultaneously selected in a selected block being defined as a page of multiple columns each containing M bits;

a bad block position data register area defined in the memory cell array to store bad block position data in such a bit position assignment scheme that one bit is assigned to one block;

a pre-decoder configured to decode address data to output a first one-hot signal with M bits, which designates a selected block position in one block set and second one-hot signals designating a selected block set position in the memory cell array;

row decoders configured to further decode the first and second one-hot signals and select a block in the memory cell array;

bad block flag latches attached to the respective row decoders for storing bad block flags in accordance with the bad block position data read from the bad block position data register area; and a selector circuit configured to sequentially select and transfer the bad block position data read from the bad block position data register area M bits by M bits to the row decoders in place of the first one-hot signal at a power-on reset time.

BRIEF DESCRIPTION OF THE DRAWINGS

FIG. 9 shows a conventional block address decoding method.

FIG. 10 shows the block address decoding method in this embodiment.

FIG. 14 shows the decoding method in case the row decoder shown in FIG. 13 is used.

DETAILED DESCRIPTION OF THE EMBODIMENTS

Illustrative embodiments of this invention will be explained with reference to the accompanying drawings below.

Figure 1:
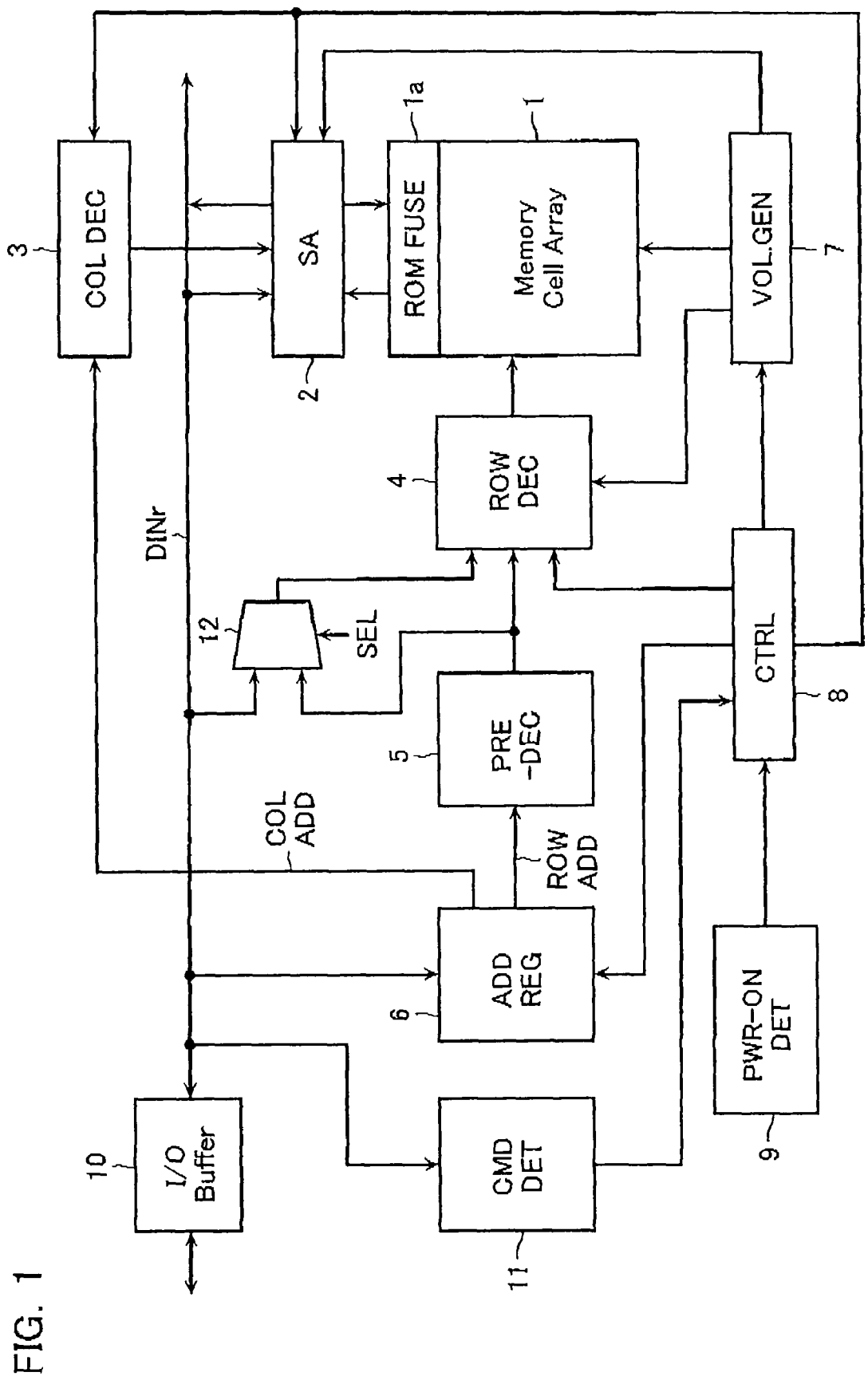
FIG. 1 shows a block configuration of a NAND-type flash memory in accordance with an embodiment.
Figure 2:
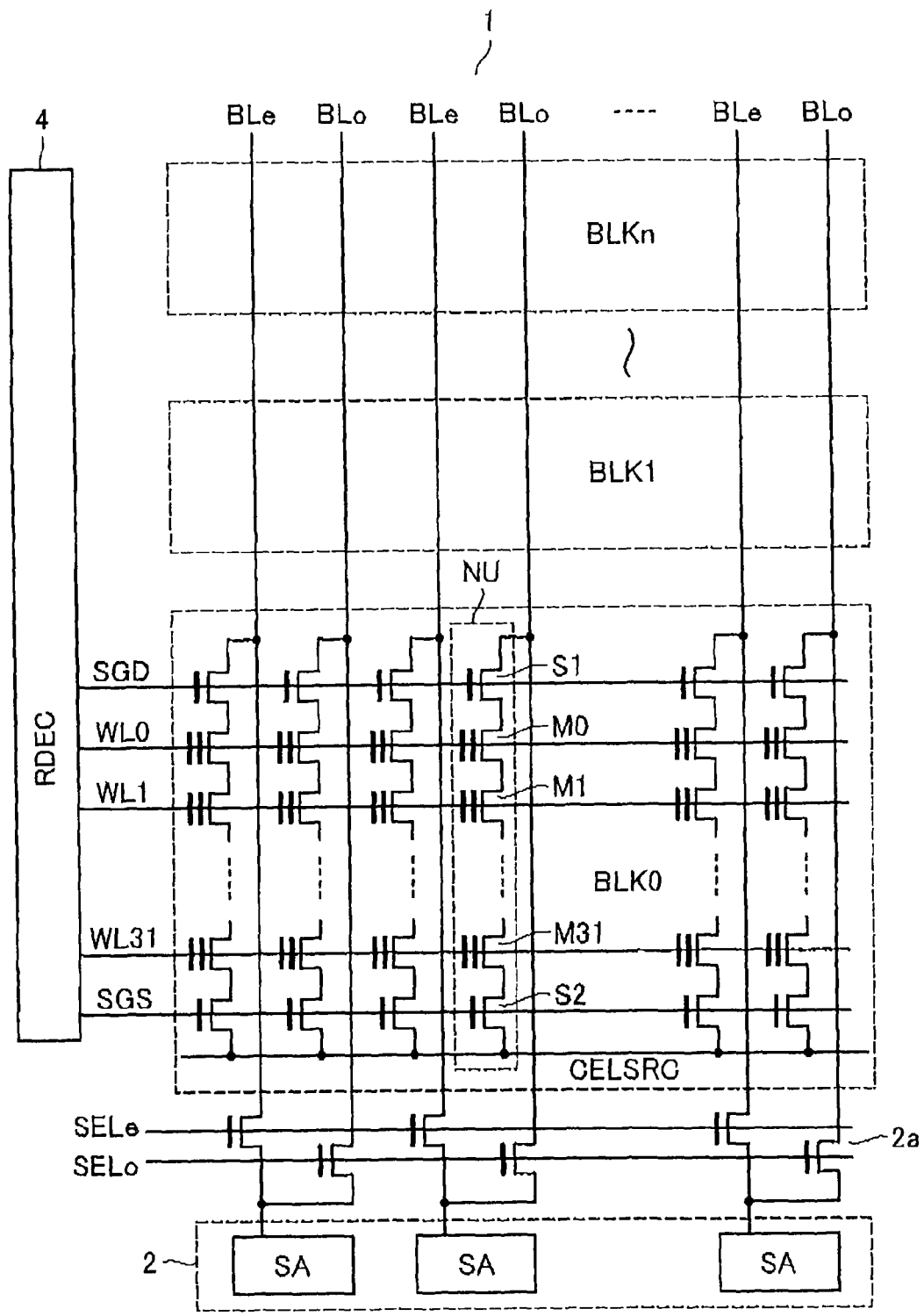
FIG. 2 shows the memory cell array of the flash memory.

FIG. 1 shows a functional block configuration of a NAND-type flash memory in accordance with an embodiment, and FIG. 2 shows the cell array configuration of the memory core. Memory cell array 1 is, as shown in FIG. 2, formed of NAND cell units (i.e., NAND strings) NU arranged, in each of which a plurality of electrically rewritable and non-volatile memory cells (32 cells in this example) M0-M31 are connected in series.

One end of the NAND cell unit NU is coupled to a bit line BL (BLe or BLo) via select gate transistor S1; and the other end to a common source line CELSRC via select gate transistor S2. Control gates of the memory cells M0-M31 are coupled to word lines WL0-WL31, respectively, while gates of the select gate transistors S1 and S2 are coupled to select gate lines SGD and SGS, respectively.

A set of NAND cell units arranged in the word line direction constitutes as a block serving as an erase unit, and plural blocks BL0-BLn are arranged in the bit line direction as shown in FIG. 2. Disposed on one end of the bit line BL is sense amplifier circuit (including data register) 2, which serves for data-reading and data-writing. Disposed on one end of the word line is row decoder 4, which serves for selecting a block and selecting a word line and a select gate line in the block.

FIG. 2 shows such an example that adjacent two bit lines (an even numbered bit line BLe and an odd numbered bit line BLo disposed adjacent to each other) share a sense amplifier S/A. That is, either one of the even numbered bit line BLe and odd numbered bit line BLo is selected via bit line selector 2a to be coupled to a sense amplifier S/A. In this case, one set of memory cells selected by a word line and all even numbered bit lies (or all odd numbered bit lines) constitutes a physical page, the whole cells in which are read or written simultaneously.

Command, address and data are input via input/output (I/O) buffer 10. Command is for designating an operation mode and decoded in command decoder 11 to be supplied to internal control circuit 8. Address is input to address register 6, and row address ROWADD and column address COLADD are transferred to pre-decoder 5 and column decoder 3 at certain timings, respectively.

Row address is decoded as multi-bit one-hot signal via pre-decoder 5, and one block and one word line therein are selected by the row decoder 4.

Write data usually supplied 1 Byte by 1 Byte via I/O buffer 10 are loaded in the sense amplifier circuit 2, and one page data are written into the memory cell array at a time. One page read data in the sense amplifier are transferred 1 Byte by 1 Byte via I/O buffer 15 to be serially output to the external.

To generate necessary high voltages in correspondence to the respective operation modes, there is prepared a high voltage generating circuit 7, which generates high voltages in accordance with instructions of the control circuit 8.

In the memory cell array 1, there is set a ROM fuse area 1a serving as a bad block position data register area for storing bad block position data detected in the die-sort test. Stored in the ROM fuse area are various kinds of initial setup data such as voltage trimming data and the like. When power-on detecting circuit 9 detects power-on, control circuit 8 executes such a power-on reset operation as to read the control data in the ROM fuse area 1a and set the voltage trimming data and so on in a certain register (not shown), and read bad block position data, thereby setting a bad block flag in the row decoder circuit 4.

Figure 3:
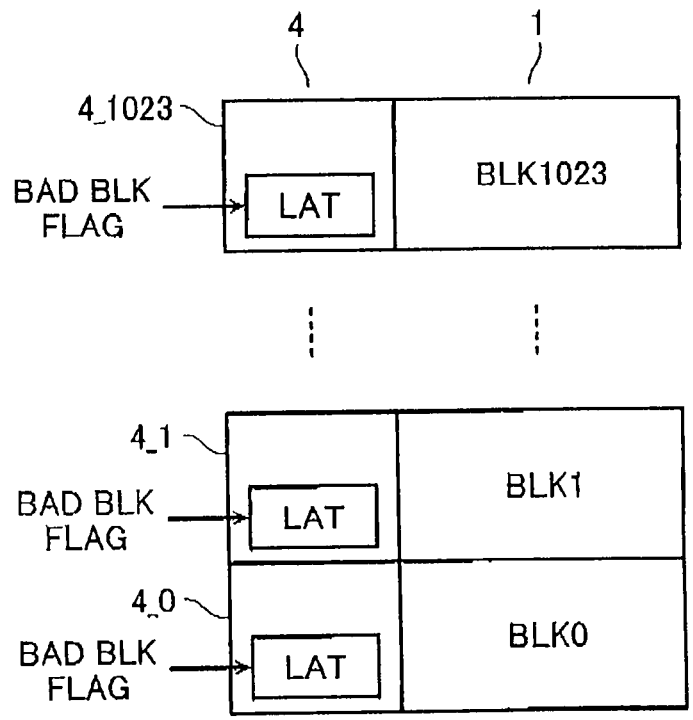
FIG. 3 shows the row decoder of the flash memory.
Figure 4:
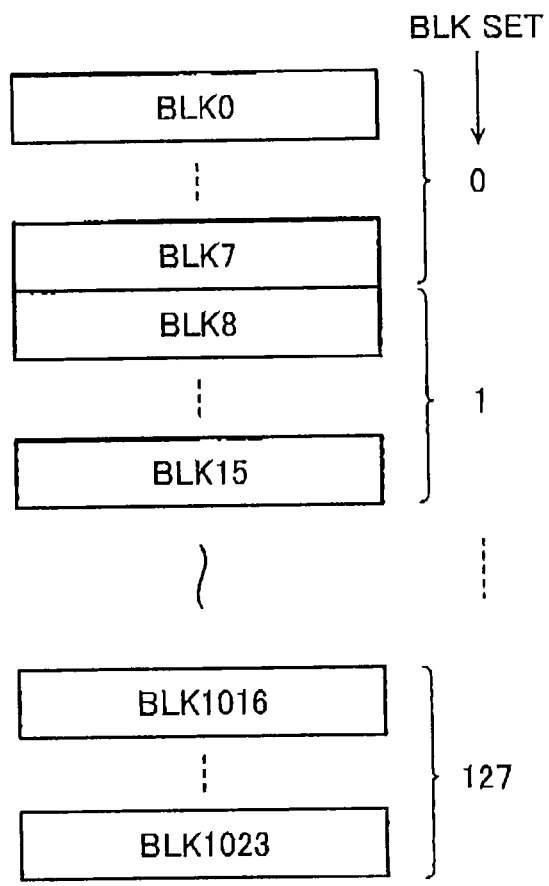
FIG. 4 shows a block set arrangement used for adapting a bit position assignment scheme in this embodiment.

FIG. 3 shows such a state that the memory cell array 1 is divided into 1024 blocks BLK0-BLK1023, and bad block flag-use latches, LAT, are attached to the respective row decoders 4_0 to 4_1023 in the row decoder circuit 4 in correspondence to the respective blocks. Although the row decoders are formed in practice as block decoders (i.e., narrow sensed row decoders) disposed for the respective blocks for selecting a block, and word line/select gate line decoders/drivers used in common to the whole blocks for selecting word lines/selecting gate lines in a block. Each of the row decoders 4_0~4_1023 shown in FIG. 4 is the former block decoder (i.e., narrow sensed row decoder).

In this embodiment, in place of the conventional scheme, in which block addresses are directly registered in the bad block data register area in the ROM fuse area 1a, every bit data in the ROM fuse area is assigned for every block in the chip. Hereinafter, the former conventional scheme is referred to as "block address directly register scheme" while the latter is referred to as "bit position assignment scheme". Explaining in detail, the bad block position data will be registered in this embodiment in such a way that there is set one-to-one correspondence between block positions in multiple blocks and column bit positions in a page.

Although the details are explained later, changing the bad block registering scheme as described above, it becomes possible to largely reduce the capacity of the bad block position data register area in the ROM fuse area 1a. Bad block position data read out the ROM fuse area 1a at the power-on reset time are replaced in part with the decoder outputs of pre-decoder 5 via selector 12, and supplied to row decoder circuit, so that a row address is selected and a bad block flag is set in the corresponding row decoder portion.

The bit position assignment scheme in this embodiment will be explained in detail below. As shown in FIG. 4, 1024 blocks in the cell array are grouped 8 blocks by 8 blocks into 128 block sets as follows: blocks BLK0 to BLK7 constitute block set 0; blocks BLK8 to BLK15 constitute block set 1; ... ; and blocks BLK1016 to BLK1024 constitute block set 127.

Figure 5:
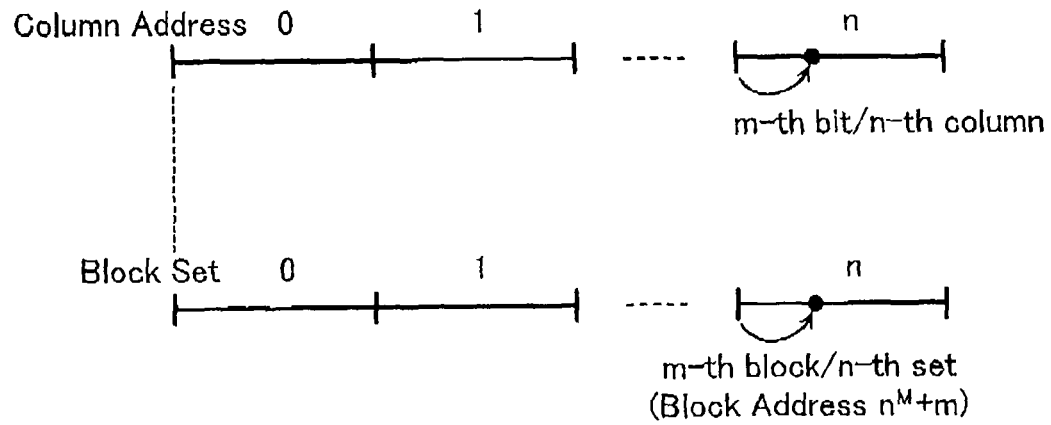
FIG. 5 shows the corresponding relationship between block addresses and column addresses used in the bit position assignment scheme.

In addition, as shown in FIG. 5, a certain corresponding relationship will be set between the column addresses of the ROM fuse area 1a and the block sets. That is, column address "n" of the ROM fuse area 1a is made to correspond to block set "n"; and m-th bit in n-th column is made to correspond to m-th block in n-th block set one-to-one correspondence, where "n" is an integer equal to or smaller than the number of block sets; and "m" is an integer equal to or smaller than the number of bits in one column, M, (i.e., the number of blocks in one block set). In the example shown in FIG. 4, M=8 (i.e., one column is formed of eight bits) is used.

Therefore, m-th bit in n-th column in the ROM fuse area 1a, which is counted from the head address, corresponds to m-th block in n-th block set (the m-th block is counted from the least side, i.e., block address $n^M+m$).

Under the above described relationship, it is supposed that in case a certain column position data is "1" in the ROM fuse area 1a, a block with a block address corresponding to the column position is defective (i.e., bad). "0" data designates that the corresponding block is not bad. For example, assuming that 7-th bit in 127-th Byte in the column address of ROM fuse area 1a is "1", it designates that the block with block address 1023 is bad.

Next, the row decoder and surround portion thereof, and the operation of setting the bad block flag will be explained in detail in comparison with the conventional scheme.

Figure 6:
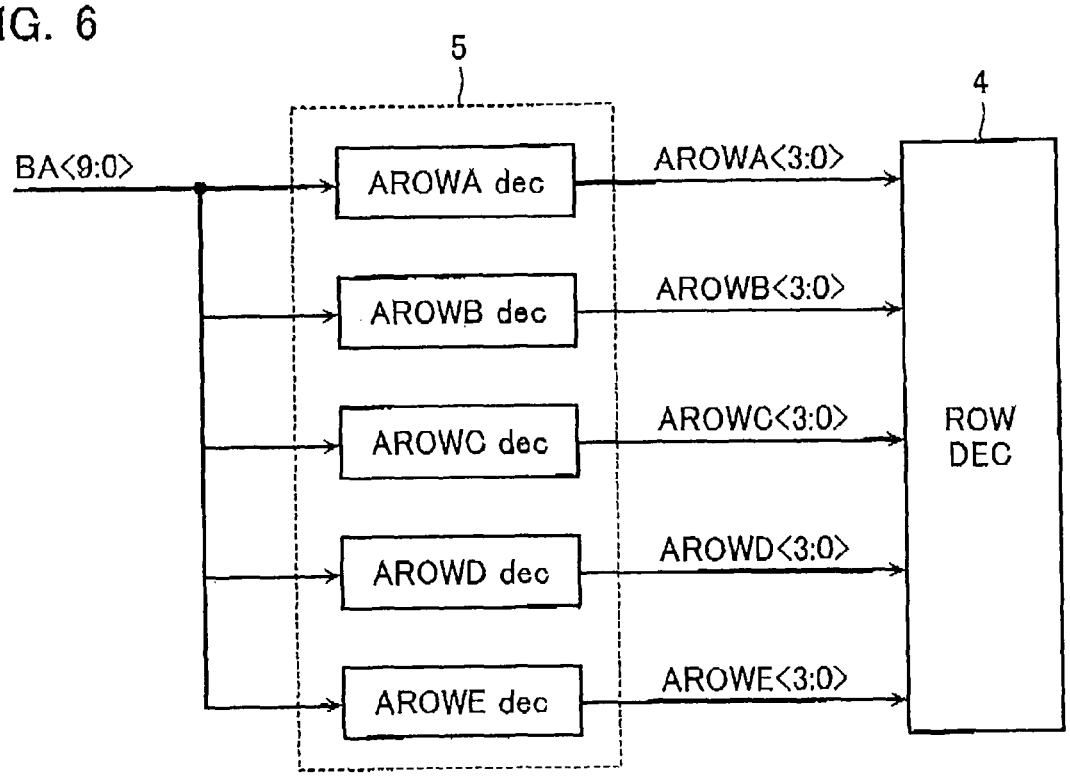
FIG. 6 shows the surrounding of the conventional row decoder.
Figure 7:
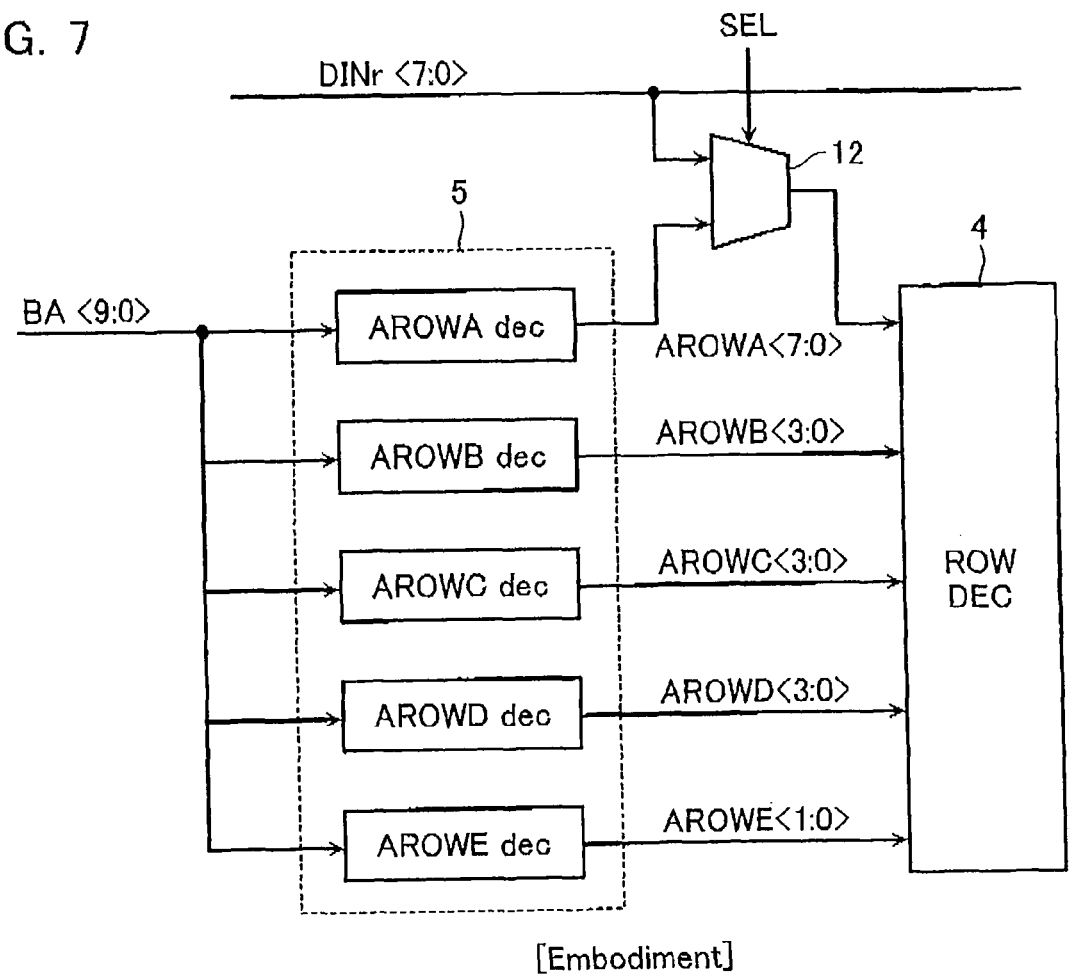
FIG. 7 shows the surrounding of the row decoder in this embodiment.

FIG. 6 shows a row decoder and surround portion thereof with a conventional scheme; and FIG. 7 shows those in this embodiment. In addition, FIG. 9 shows a block address decoding method in the conventional scheme; and FIG. 10 shows that in this embodiment.

Initially, for comparing this embodiment with the conventional scheme, the conventional "block address directly register scheme" and the operation of setting the bad block flag in the conventional scheme will be explained.

In this block address directly registered scheme, address data read out in the sense amplifier circuit 3 at the power on reset time are transferred to address register 6 via data bus DINr with two cycles of 8 bits by 8 bits, resulting in that 10-bit block address data BA<9:0> is obtained.

After a bad block flag is set in the row decoder of the first bad block, address data of the second bad block are transferred to the sense amplifier circuit, and a bad block flag is set in the row decoder of the second bad block with the same procedure as described above. As described above, bad block flags are set in the corresponding row decoders in correspondence with bad block addresses registered in the ROM fuse area.

FIG. 9 shows the detailed decoding method. 10-bit block address data BA<9:0> is decoded in the pre-decoder 5 into five signals AROWA, AROWB, AROWC, AROWD and AROWE each being formed of 4 bits. These pre-decoded signals are, as shown in FIG. 9, one-hot signals each having only one data "1".

Figure 8:
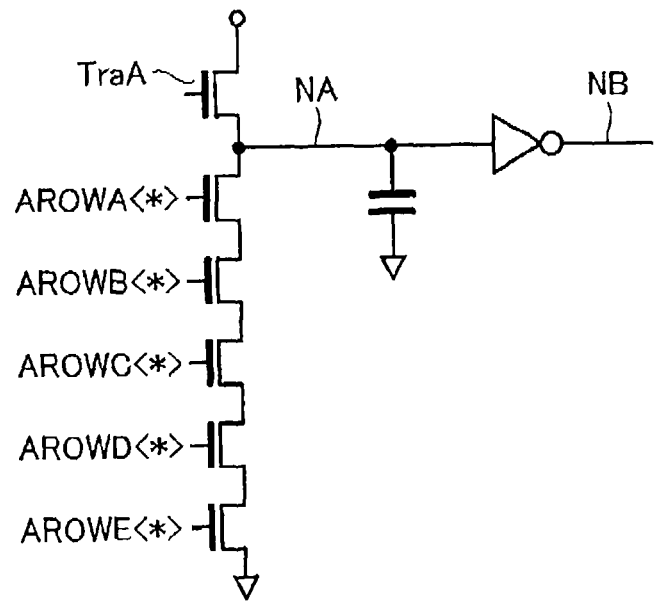
FIG. 8 shows a basic row decoder configuration in this embodiment.

By use of such the pre-decode scheme, it becomes possible to use a NAND gate for each row decoder. Pre-decoded signal AROWA<*> shown in FIG. 8 designates that one bit(*) is selected in 4-bit signal AROWA<3:0> and input to the gate. AROWB<*>, AROWC<*>, AROWD<*> and AROWE<*> are the same as the above-described example.

For example, AROWA<0>, AROWB<0>, AROWC<0>, AROWD<0> and AROWE<0> are coupled to the row decoder of block address 0. AROWA<3>, AROWB<3>, AROWC<3>, AROWD<3> and AROWE<3> are coupled to the row decoder of block address 1023.

The block selecting method with the above-described row decoder will be explained below. To designate the block address as described above, 10-bit block address data BA<9:0> are input. Since the bit width of the data transfer bus DINr is of 8 bits, the block address data are transferred two times half by half, and formed as 10-bit address signal BA<9:0> at the address register.

This address data is pre-decoded to be input to the row decoder circuit. In each row decoder shown in FIG. 8, node NA is precharged to be "H" via transistor TraA. Assuming that, for example, BA<9:0>=10'h000 is input for selecting block address 0, pre-decoded signals in the pre-decoder 5 are as follows: AROWA<3:0>=4'b0001, AROWB<3:0>=4'b0001, AROWC<3:0>=4'b0001, AROWD<3:0>=4'b0001, and AROWE<3:0>=4'b0001.

In this case, at block address 0, all serially connected transistors in the row decoder are turned on, and precharged node NA is discharged, so that the selecting block signal node NB becomes "H". This designates that block BLK0 is in a selected state. As described above, one block may be selected in 1024 blocks.

Next, the block address registering method with the "bit position assignment scheme" in accordance with this embodiment and the bad block flag setting operation will be explained in detail.

To achieve the bit position assignment scheme explained with reference to FIGS. 4 and 5, it is required of the surround of the row decoder circuit to be modified as shown in FIG. 7, and it is in need of adapting the decode method shown in FIG. 10. That is, in the operations excepting the bad block flag setting operation, as shown in FIG. 10, pre-decoder 5 is so formed as to output one of pre-decoded signals, AROWA, to be formed as 8-bit one-hot signal that is a data unit normally dealt with.

In case of the bad block flag setting, DINr<7:0> is directly input to the row decoder as AROWA<7:0> without through the pre-decoder 5. In this case, as different from the case shown in FIG. 6, the first decode portion AROWAdec in the pre-decoder 5 shows the block position information in a block set defined by AROWB, AROWC AROWD and AROWE. The second decode portion, which contains AROWBdec to AROWEdec, output pre-decoded signals, 4-bit one-hot signals AROWB, AROWC and AROWD and 2-bit one-hot signal AROWE, which designates a block set position in the plural block sets (i.e., in the memory cell array).

Data read from the ROM fuse area to the sense amplifier circuit 2 at the power-on reset time are transferred to data bus DINr 8 bits (=1 Byte) by 8 bits. There is, no need of storing these data in the address register 6 because these are not usual block address data.

Data transferred to data bus DINr 1 Byte by 1 Byte are sequentially selected via selector 12, which is controlled by select signal SEL becoming "H" at the power-on reset time, and input to the row decoder 4 in place of the decode output AROWA[7:0] of the first decode portion AROWAdec of the pre-decoder 5. At this time, supplied to the second decode portion, AROWBdec to AROWEdec, are input data for sequentially outputting the block set position data in the plural blocks.

The bad block flag set operation will be explained in detail below. Initially, data of the head column address, which corresponds to block set 0, is read out to the data bus DINr. At this time, the initial state is set as follows: AROWB<3:0>=4'b0011; AROWC<3:0>=4'b0001; AROWD<3:0>=4'b0001; and AROWE<1:0>=2'b01. This designates that block set 0 shown in FIG. 4 is in a selected state.

Although data on the data bus DINr is input as AROWA[7:0] in place of the decode output of the decode portion AROWAdec, in the selected state of the block set 0, AROWA<0>, AROWA<1> AROWA<2>, AROWA<3>, AROWA<4>, AROWA<5>, AROWA<6> and AROWA<7> designate blocks BLK0, BLK1, BLK2, BLK3, BLK4, BLK5, BLK6 and BLK7, respectively. That is, only a block with bad block data "1" in the block set 0 is selected, and a bad block flag is set in the corresponding row decoder portion.

For example, if AROWA=8'b1100_0011 in the selected state of block set 0, the bad block flags will be set in blocks BLK7, BLK6, BLK1 and BLK0 with block addresses 7, 6, 1 and 0, respectively. In case all blocks are defective in the block set 0, all 8 bits are "1" in the head column of ROM fuse area. In this case, AROWA<7:0>=8'b1111_1111 will be selected via the selector 12. Therefore, blocks BLK0 to BLK7 are selected simultaneously, and bad block flags will be set in these blocks simultaneously.

Next, at the timing when data of the block set 1 is read out to data bus DINr, pre-decoded signals are exchanged as follows: AROWB<3:0>=4'b0010; AROWC<3:0>=4'b0001; AROWD<3:0>=4'b0001; and AROWE<1:0>=2'b01. As a result, bad block flags will be set at a time in the row decoder portions corresponding to bad blocks in the block set 1.

As described above, exchanging AROWB<3:0>, AROWC<3:0>, AROWD<3:0> and AROWE<1:0> in accordance with the decode scheme shown in FIG. 10 at the timing of exchanging the read column address, it becomes possible to set or not set bad block flags for 8 blocks simultaneously. In other words, reading data of 128 Bytes, it is able to set bad block flags for 1024 blocks.

According to the bit position assignment scheme in accordance with this embodiment, 128 Byte data are enough for setting bad block flags for 1024 blocks. Even if a data unit is formed of true data and complementary data thereof, and there are prepared two data sets, the bad block register may be performed with 512 Bytes. Therefore, by use of this bad block register scheme, it becomes easy to prepare four data sets for increasing the reliability more.

The features of this embodiment will be summarized as follows: (1) Bad block information may be registered with a small capacity, so that it becomes possible to register substantially all bad blocks in a chip; (2) since the bad block register capacity is small, it becomes possible to store back-up data in a blank area, thereby making the reliability of the bad block address higher; and (3) even if there are many bad blocks in a chip, for example, ¾ blocks in a chip are bad, it becomes possible to ship the chip as one of ¼ capacity, and this makes the product cost to be reduced.

As the size of bit lines/word lines is further shrunk in the future, the performance will be limited in accordance with the increase of the sheet resistance, wiring capacitance and the like. To achieve a sufficient performance, it is in need of lessening the word line and bit line length, and it becomes a method of easily solving this problem that the number of planes is increased in the memory chip. For example, in case a memory chip has two planes, and one of them has a fatal defective word line, the memory chip will be dealt with a bad chip in the conventional scheme. By contrast, according to the bad block register method in accordance with this embodiment, it becomes possible to ship the memory chip, which has a half capacity with one bad plane registered as bad blocks.

Explained in the above-described embodiment is such a case that row decoders are arranged on one ends of word lines in the cell array (this is referred to as "one-side row decoder scheme", hereinafter). By contrast, the present invention is adaptable to another case that row decoders are dispersedly arranged on the both sides of the cell array (this is referred to as "both-side row decoder scheme", hereinafter). For example, row decoders are disposed in such a manner that a first group is on the right side of even-numbered blocks; and a second group on the left side of the odd-numbered blocks.

In case of the one-side row decoder scheme, it is in need of disposing one row decoder within the height of one block. By contrast, in case of the both-side row decoder scheme, it is allowed to dispose one row decoder within the height of two blocks. Which is to be selected should be determined in consideration of some restrictions such as (1) layout size, and (2) lithography.

Figure 11:
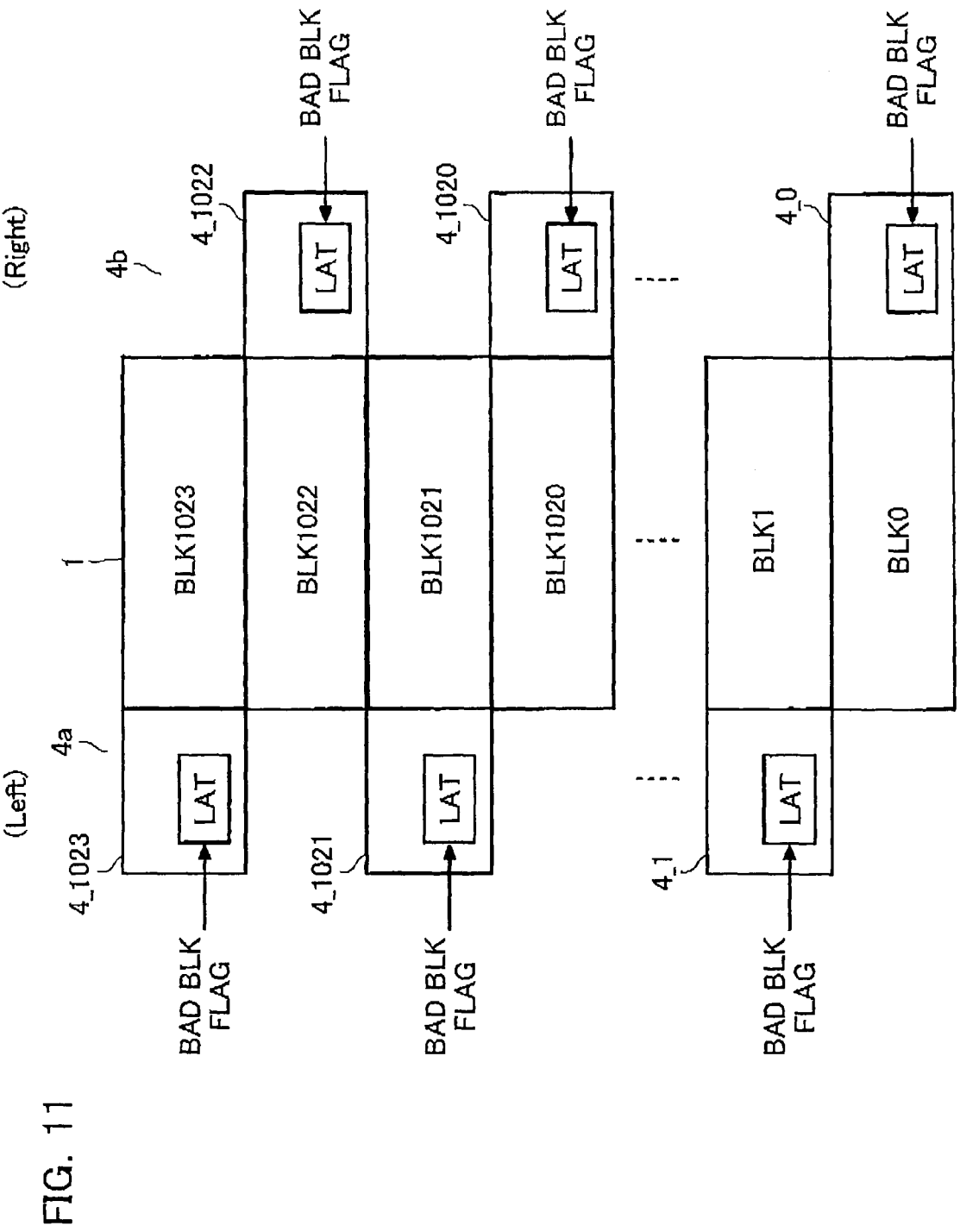
FIG. 11 shows a row decoder configuration with row decoders disposed on both sides.

FIG. 11 shows the row decoder circuits 4(4a, 4b), to which the both-side row decoder scheme is adapted. Row decoders 4_0, . . . , 4_1020, 4_1022 are disposed on the right side of even-numbered blocks while row decoders 4_1, . . . , 4_1021, 4_1023 are disposed on the left side of odd-numbered blocks.

Figure 12:
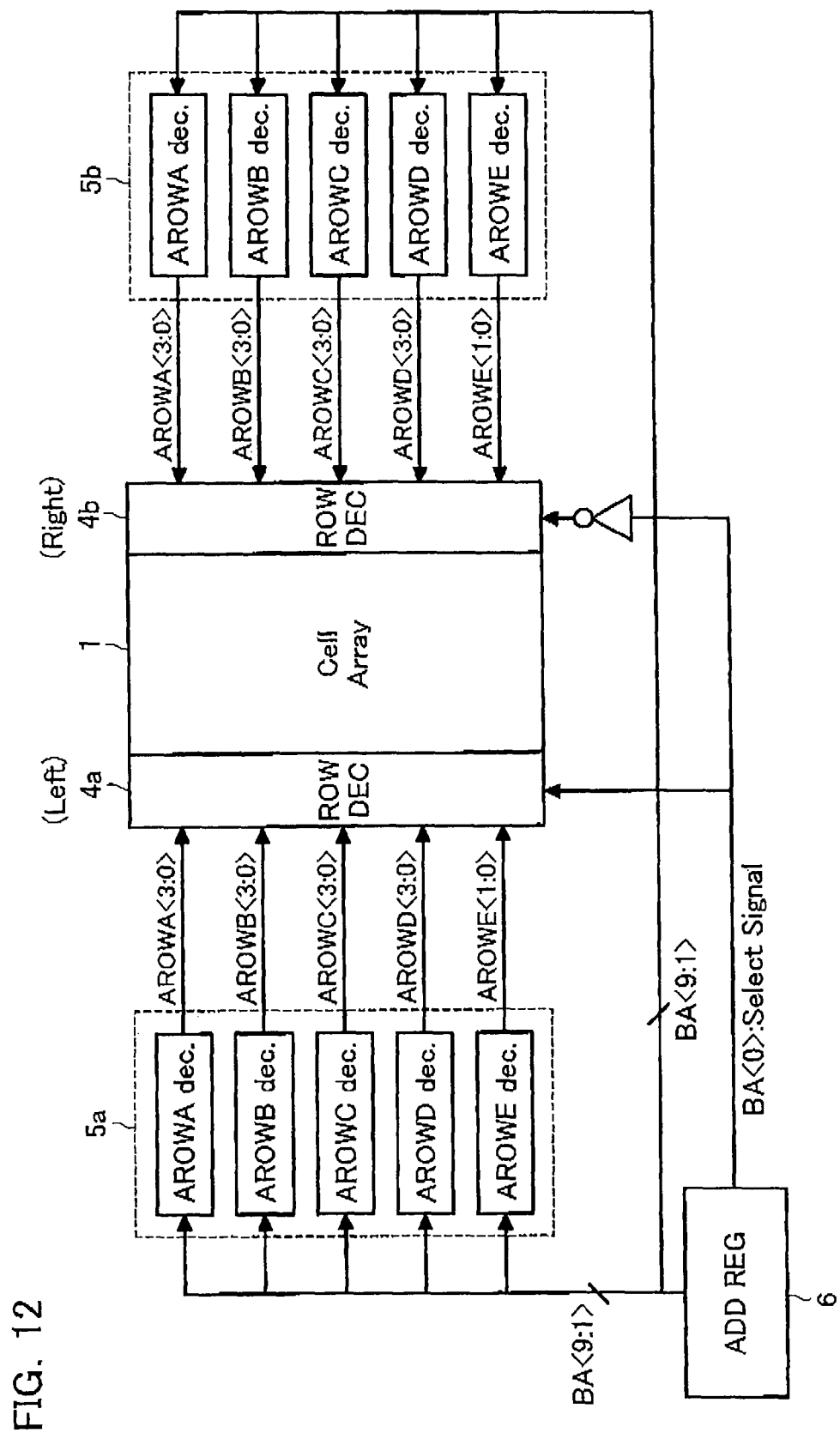
FIG. 12 shows the surrounding of the conventional row decoder.
Figure 13:
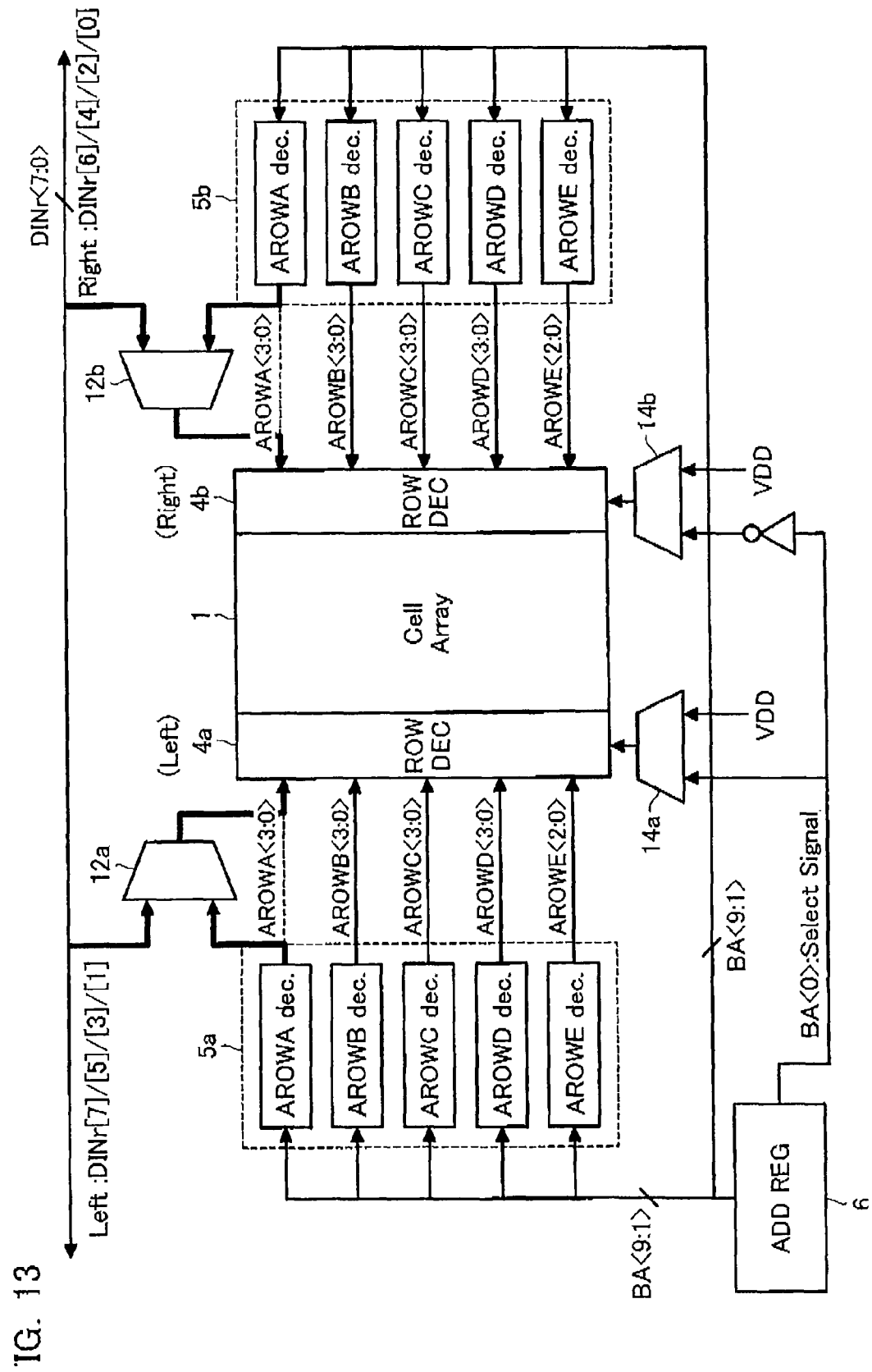
FIG. 13 shows the surrounding of the row decoder in this embodiment.

FIG. 12 shows the surrounding of the row decoder circuit 4 in a usual case that the both-side row decoder scheme is adapted while FIG. 13 shows the surrounding of the row decoder circuit 4 in accordance with this embodiment.

As shown in FIGS. 12 and 13, the lowest bit BA<0> in the block address data BA<9:0> serves as a left/right selection signal. The remaining block address data BA<9:1> are decoded to five one-hot signals AROWA, AROWB, AROWC, AROWD and AROWE via pre-decoders 5a and 5b.

As shown in FIG. 13, there are prepared selectors 14a and 14b in this embodiment, to which the select signal BA<0> is applied. These selectors 14a and 14b are used to be able to simultaneously activate the both row decoders 4a and 4b at a power-on reset time.

FIG. 14 shows an example of a decode method. Pre-decoders 5a and 5b, which are disposed on the left side and right side, are the same circuits.

At a usual block selection time excepting the bad block setting operation, block decode is, for example, performed as follows: in case of selecting block address 0, BA<9:0>=10'7h000 is input, decoded outputs of the pre-decoders 5a and 5b are, AROWA<3:0>=4'b0001, AROWB<3:0>=4'b0001, AROWC<3:0>=4'b0001, AROWD<3:0>=4'b0001, and AROWE<2:0>=2'b01.

In this case, selected on the left side is block BLK0 while selected on the right side is block BLK1. However, since left/right selection signal is BA<0>=1'b0, only the row decoder 4b on the right side is selected by selector 4b to be active, so that only block BLK0 is selected.

Next, the block address register scheme and bad block flag setting operation with the bit position assignment scheme in accordance with this embodiment will be explained in detail. The basic operation is the same as above-described embodiment.

As shown in FIG. 14, pre-decode signals AROWA (decode outputs of the first decode portions AROWAdec) are kept as 4 bits because 4 bits of DINr[6], [4], [2], [0] and 4 bits of DINr[7], [5], [3], [1] in DINr[7:0] are coupled to right side and left side row decoders 4b and 4a, respectively. For this purpose, it is required of the both of simultaneously selecting-use selectors 14a and 14b shown in FIG. 13 to be set in a selected state in a bad block flag setting mode (i.e., at a power-on reset time).

While the bad block flag is set, read data on the data bus, DINr[7:0], are input to the row decoder circuits 4a/4b on the left/right sides as AROWA<3:0> via selectors 12a and 12b without pre-decoders 5a and 5b. Explaining in detail, 4 bits of DIN[6], [4], [2] and [0] are input to the right side while 4 bits of DIN[7], [5], [3] and [1] are input to the left side.

At this time, the respective bits of AROWA designate block positions in a block set defined by AROWB, AROWC, AROWD and AROWE. That is, the second decode portion (AROWBdec to AROWEdec) outputs pre-decode signals (one-hot signals AROWB, AROWC and AROWD each being of 4 bits, and one-hot signal AROWE of 2 bits) for designating a block set position selected in the multiple block sets.

Read data from the ROM fuse area to the sense amplifier circuit 2 at a power-on time are transferred to data bus DINr 8 bits (=1 Byte) by 8 bits. It is not required of this data in the bit position assignment scheme to be held in the address register 6 because it is different from the conventional block address data.

Data transferred to data bus DINr 1 Byte by 1 Byte are sequentially selected with selectors 12a and 12b controlled by selection signal SEL, which becomes "H" at a power-on reset time, and input to row decoder circuits 4a and 4b in place of the pre-decoded signals AROWA[3:0] of the first decode portions AROWdec in the pre-decoders 5a and 5b. Applied at this time to the second decode portion (AROWBdec to AROWEdec) are set in such an input state as to make the decode portion sequentially output block set positions in the multiple blocks.

The method of setting the bad block flag will be explained in detail below.

First, data of the head column address corresponding to that of block set 0 will be read to data line DINr. As an initial state, AROWB<3:0>=4'b0001, AROWC<3:0>=4'b001, AROWD<3:0>=4'b0001 and AROWE<1:0>=2'b01 are set. This state designates that block set 0 shown in FIG. 4 is selected.

At this time, as RORWA<3:0> on the right side, data on DINr<6>, DINr<4>, DINr<2> and DINr<0> are input. AROWA<0>, AROWA<1>, AROWA<2> and AROWA<3> on the right side designate blocks BLK0, BLK2, BLK4 and BLK6, respectively, in this block set 0 selected state.

On the other hand, as AROWA<3:0> on the left side, data on DINr<7>, DINr<5>, DINr<3> and DINr<1> are input. AROWA<0>, AROWA<1>, AROWA<2> and AROWA<3> on the left side designate blocks BLK1, BLK3, BLK5 and BLK7, respectively, in this block set 0 selected state.

As a result, only blocks with the bad block information "1" in the block set 0 are set in a selected state, bad block flag is set for these blocks. For example, in case of AROWA=4'b0011 on the right side in this block set 0 selected state, bad block flag will be set for two blocks BLK0 and BLK2. By contrast, in case of AROWA=4'b0111 on the left side in this block set 0 selected state, bad block flag will be set for two blocks BLK1 and BLK3.

On the other hand, if all blocks are bad in the block set 0, all 4 bits on the left and right side are set at "1" in the above-described head column address in the ROM fuse area. At this time, data selected by selectors 12a and 12b are AROWA<3:0>=4'b1111 on the both Sides. Therefore, blocks BLK0 to BLK7 are set simultaneously in the selected state, and bad block flag will be set for these blocks BLK0 to BLK7 simultaneously.

Next, at the timing when data of block set 1 are read to data line DINr, pre-decoded signals are exchanged as follows: AROWB<3:0>=4'b0010; AROWC<3:0>=4'b0001; AROWD<3:0>=4'b0001; and AROWE<1:0>=2'b01. As a result, bad block flag may be set at one in the row decoders corresponding to bad blocks in the block set 1.

As described above, exchanging AROWB<3:0>, AROWC<3:0>, AROWD<3:0> and AROWE<1:0> at the respective exchanging timings of the read column address, it becomes possible to set bad block flags for 8 blocks per each column read (=1 Byte), and for 1024 blocks during the data read operation of all columns, (=128 Bytes).

Next, as an embodiment, an electric card using the non-volatile semiconductor memory devices according to the above-described embodiments and an electric device using the card will be described bellow.

Figure 15:
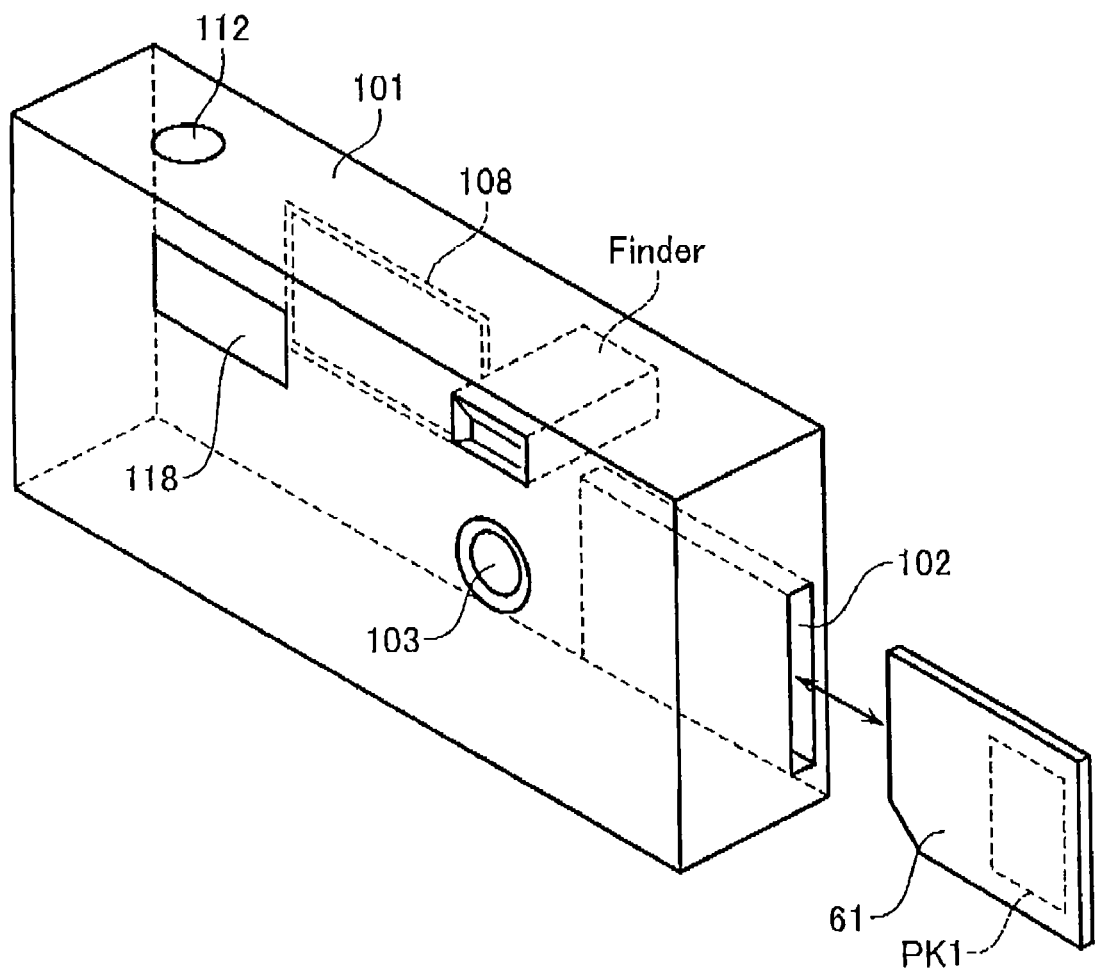
FIG. 15 shows another embodiment applied to a digital still camera.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
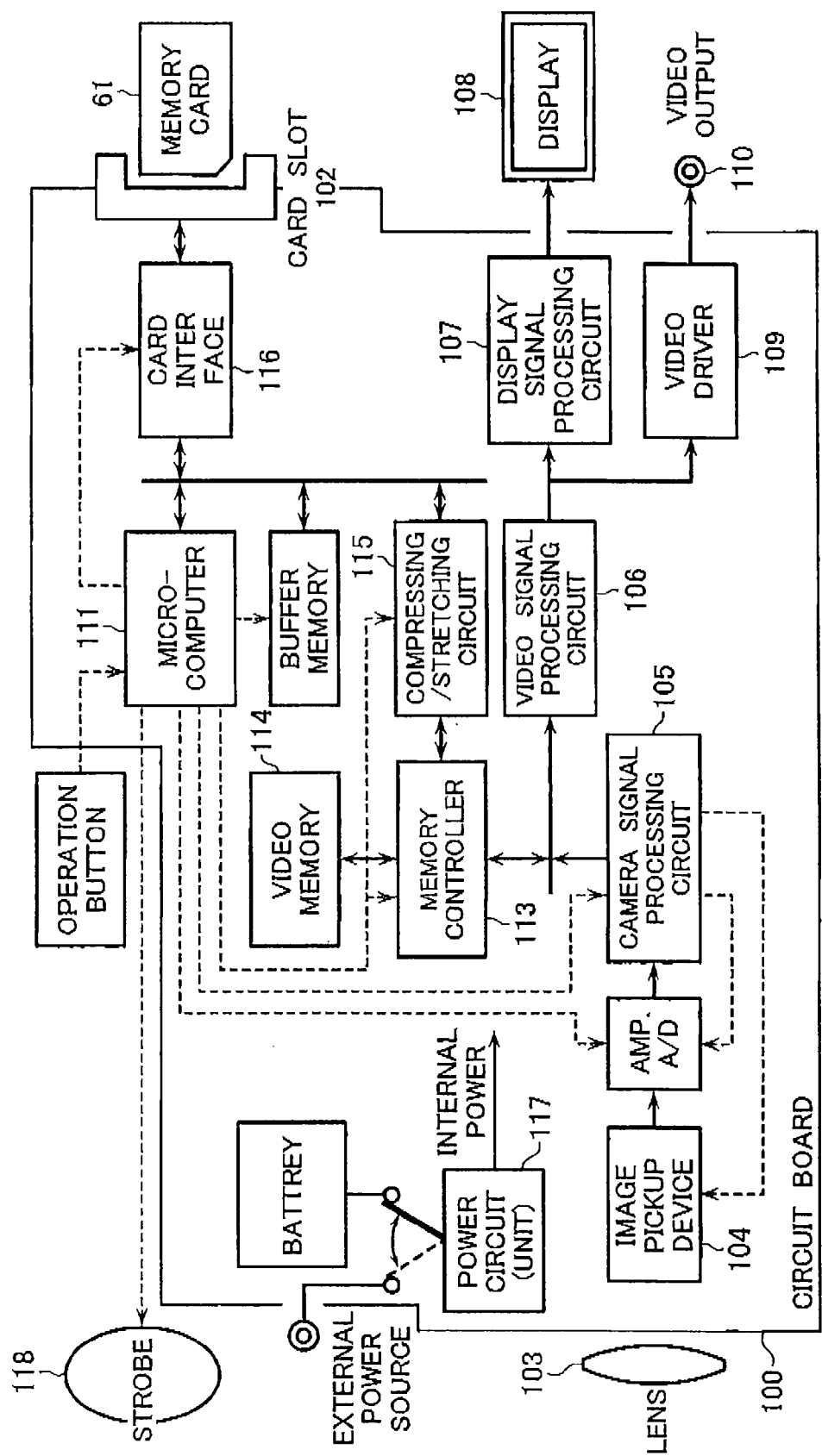
FIG. 16 shows the internal configuration of the digital still camera.
Figure 17A:
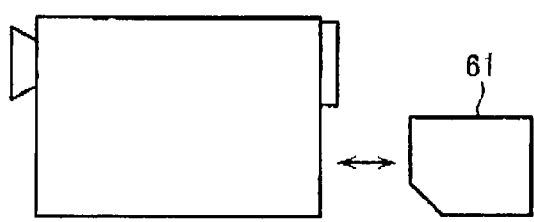
FIGS. 17A to 17J show other electric devices to which the embodiment is applied.
Figure 17F:
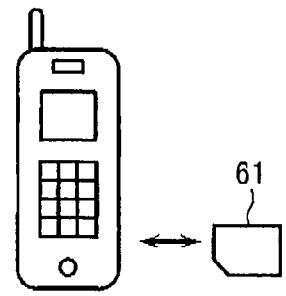
Figure 17B:
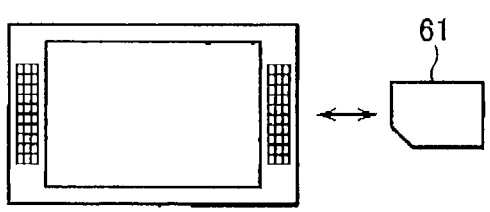
Figure 17G:
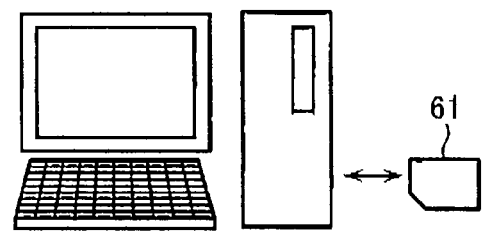
Figure 17C:
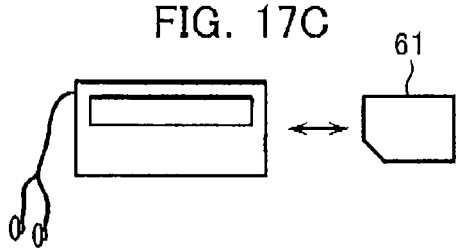
Figure 17H:
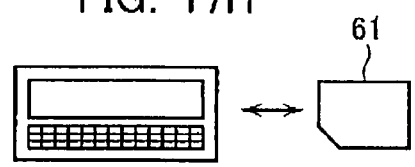
Figure 17D:
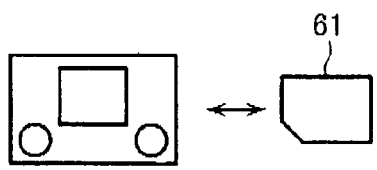
Figure 17I:
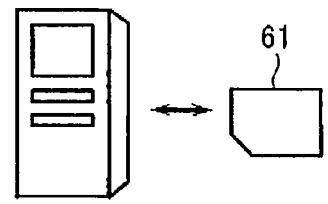
Figure 17E:
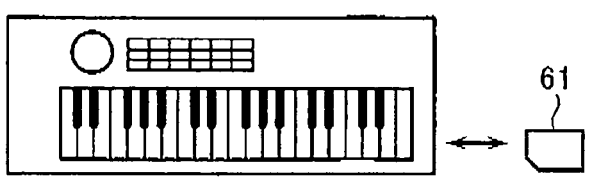
Figure 17J:
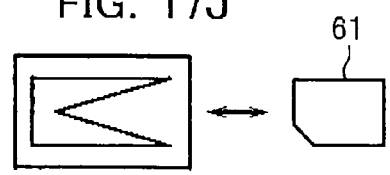

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AR), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

This invention is not limited to the above-described embodiments. It will be understood by those skilled in the art that various changes in form and detail may be made without departing from the spirit, scope, and teaching of the invention

What is claimed is:

1. A non-volatile semiconductor memory device comprising:
   a memory cell array formed of multiple blocks, in which word lines and bit lines are arranged to cross to each other, electrically rewritable and non-volatile memory cells are arranged at respective cross-points of the word lines and the bit lines, and at least a portion of the memory cells arranged along the word line makes one page of simultaneously accessed memory cells in a selected block;
   a bad block position data register area defined in the memory cell array to store bad block position data;
   an address decoder circuit configured to select a block in the memory cell array; and
   bad block flag latches disposed in the address decoder circuit, bad block flags being set in the bad block flag latches in accordance with the bad block position data read out the bad block position data register area, wherein
   the memory cell array includes a plurality of block sets each including a plurality of the blocks, and wherein
   the bad block position data in the bad block position data register area are defined by such a bit position assignment scheme that one bit is assigned to one block under the condition that a column address for selecting the bit lines of the bad block position data register area corresponds to a block set, and a bit number of data read out via the bit line selected by the column address corresponds to a block position in the block set.

2. The non-volatile semiconductor memory device according to claim 1, wherein
   the memory cell array includes multiple block sets each containing M blocks, and the one page is defined by multiple columns each containing M bits, wherein
   the bit position assignment scheme is defined by the following one-to-one correspondence: m-th block in n-th block set in the memory cell array is made to correspond to m-th bit in n-th column in the one page (where, "n" is an integer equal to or smaller than the number of the block sets, and "m" is an integer equal to or smaller than M).

3. The non-volatile semiconductor memory device according to claim 2, wherein
   the address decoder circuit comprises:
   a pre-decoder configured to decode address data to output multiple one-hot signals; and
   row decoders configured to further decode the one-hot signals and select a block, the bad block flag latches being attached to the respective row decoders, wherein
   the pre-decoder comprises:
   a first decode portion configured to decode the address data to output a one-hot signal with M bits, which designates a selected block position in one block set; and
   a second decode portion configured to decode the address data to output one-hot signals designating a selected block set position in the memory cell array.

4. The non-volatile semiconductor memory device according to claim 3, further comprising:
   a sense amplifier circuit configured to read out one page data in a selected block in the memory cell array; and
   a data bus, to which one page data in the sense amplifier circuit are transferred M bits by M bits;
   a selector configured to sequentially select and transfer the M bits data transferred to the data bus from the sense amplifier circuit to the row decoders in place of the pre-decoded signal output from the first decode portion at a power-on reset time.

5. The non-volatile semiconductor memory device according to claim 4, wherein
   at a normal operation time, one block is selected in accordance with the decode output of the first decode portion of the pre-decoder in a block set selected in accordance with the decode output of the second decode portion of the pre-decoder, and
   at the power-on reset time, the second decode portion of the pre-decoder is set in input states for sequentially selecting the block sets, and one or more blocks are selected in accordance with the M bits data selected by the selector in place of the decode output of the first decode portion, so that the bad block flags are set for the selected blocks.

6. The non-volatile semiconductor memory device according to claim 1, wherein
   the memory cell array comprises word lines and bit lines arranged to cross to each other, and the memory cells disposed at the respective cross-points of the word lines and the bit lines, multiple memory cells arranged in the bit line direction being connected in series to constitute a NAND cell unit, a set of NAND cell units arranged in the word line direction constituting the block.

7. The non-volatile semiconductor memory device according to claim 3, wherein
   the pre-decoder and the row decoders are disposed on one side of the respective blocks in the memory cell array.

8. The non-volatile semiconductor memory device according to claim 3, wherein
   the pre-decoder and the row decoders are dispersedly disposed on the both sides of the respective blocks in the memory cell array.

9. The non-volatile semiconductor memory device according to claim 8, wherein
   the pre-decoder is divided into a first pre-decoder part and a second pre-decoder part, which are dispersedly disposed on the both sides of the respective blocks, and the row decoders are divided into first row decoder parts and second row decoder parts, which are arranged on one sides of even numbered blocks and on the reverse sides of odd numbered blocks respectively.

10. The non-volatile semiconductor memory device according to claim 9, further comprising:

a data bus, to which one page data read from the bad block position data register area are output M bits by M bits;

first and second selectors disposed on the both sides of the respective blocks to transfer the M bits data on the data bus half-and-half to the first and second row decoder parts at a power-on reset time; and third and fourth selectors disposed on the both sides of the respective blocks to simultaneously activate the first and second row decoder parts at the power-on reset time, wherein at the power-on reset time, the second decode portions of the first and second pre-decoder parts are set in input states for sequentially selecting the block sets, and one or more blocks are selected in accordance with the M bits data selected by the first and second selectors in place of the decode outputs of the first decode portions of the first and second pre-decoders under the condition that the third and fourth selectors are set to activate the first and second row decoder parts simultaneously, so that the bad block flags are set sequentially for the multiple block sets, and set simultaneously for each selected block set.

11. A non-volatile semiconductor memory device comprising:

a memory cell array formed of electrically rewritable and non-volatile memory cells arranged therein, the memory cell array including multiple block sets each containing M blocks, a set of the memory cells simultaneously selected in a selected block being defined as a page of multiple columns each containing M bits;

a bad block position data register area defined in the memory cell array to store bad block position data in such a bit position assignment scheme that one bit is assigned to one block;

a pre-decoder configured to decode address data to output a first one-hot signal with M bits, which designates a selected block position in one block set and second one-hot signals designating a selected block set position in the memory cell array;

row decoders configured to further decode the first and second one-hot signals and select a block in the memory cell array;

bad block flag latches attached to the respective row decoders for storing bad block flags in accordance with the bad block position data read from the bad block position data register area; and a selector circuit configured to sequentially select and transfer the bad block position data read from the bad block position data register area M bits by M bits to the row decoders in place of the first one-hot signal at a power-on reset time.

12. The non-volatile semiconductor memory device according to claim 11, wherein the bit position assignment scheme is defined by the following one-to-one correspondence: m-th block in n-th block set in the memory cell array is made to correspond to m-th bit in n-th column in the one page (where, "n" is an integer equal to or smaller than the number of the block sets, and "m" is an integer equal to or smaller than M).

13. The non-volatile semiconductor memory device according to claim 11, wherein at a normal operation time, one block is selected in accordance with the first one-hot signal in a block set selected in accordance with the second one-hot signals, and at the power-on reset time, the pre-decoder is set in input states for sequentially selecting the block sets, and one or more blocks are selected in accordance with the M bits data selected by the selector circuit, so that the bad block flags are set for the selected blocks.

14. The non-volatile semiconductor memory device according to claim 11, wherein the memory cell array comprises word lines and bit lines arranged to cross to each other, and the memory cells disposed at the respective cross-points of the word lines and the bit lines, multiple memory cells arranged in the bit line direction being connected in series to constitute a NAND cell unit, a set of NAND cell units arranged in the word line direction constituting the block.

15. The non-volatile semiconductor memory device according to claim 11, wherein the pre-decoder and the row decoders are disposed on one side of the respective blocks in the memory cell array.

16. The non-volatile semiconductor memory device according to claim 11, wherein the pre-decoder and the row decoders are dispersedly disposed on the both sides of the respective blocks in the memory cell array.

17. The non-volatile semiconductor memory device according to claim 16, wherein the pre-decoder is divided into a first pre-decoder part and a second pre-decoder part, which are dispersedly disposed on the both sides of the respective blocks, and the row decoders are divided into first row decoder parts and second row decoder parts, which are arranged on one sides of even numbered blocks and on the reverse sides of odd numbered blocks, respectively.

18. The non-volatile semiconductor memory device according to claim 17, further comprising:

a sense amplifier circuit configured to read one page data in the memory cell array;

a data bus, to which the one page data in the sense amplifier circuit are output M bits by M bits;

first and second selectors disposed on the both sides of the respective blocks to constitute the selector circuit for transferring the M bits data on the data bus half-and-half to the first and second row decoder parts at a power-on reset time; and third and fourth selectors disposed on the both sides of the respective blocks to simultaneously activate the first and second row decoder parts at the power-on reset time, wherein at the power-on reset time, the pre-decoder is set in input states for sequentially selecting the block sets, and one or more blocks are selected in accordance with the M bits data selected by the first and second selectors in place of the second one-hot signals under the condition that the third and fourth selectors are set to activate the first and second row decoder parts simultaneously, so that the bad block flags are set sequentially for the multiple block sets, and set simultaneously for each selected block set.

* * * * *